US007616855B2

(12) United States Patent
Catrysse et al.

(10) Patent No.: US 7,616,855 B2
(45) Date of Patent: Nov. 10, 2009

(54) INTEGRATED WAVEGUIDE AND METHOD FOR DESIGNING INTEGRATED WAVEGUIDE

(75) Inventors: Peter B Catrysse, Palo Alto, CA (US); John S. Wenstrand, Menlo Park, CA (US)

(73) Assignee: Avago Technologies General IP (Singapore) Pte. Ltd.

( * ) Notice: Subject to any disclaimer, the term of this patent is extended or adjusted under 35 U.S.C. 154(b) by 870 days.

(21) Appl. No.: 10/989,118

(22) Filed: Nov. 15, 2004

(65) Prior Publication Data

US 2006/0104564 A1 May 18, 2006

(51) Int. Cl.
*G02B 6/44* (2006.01)
(52) U.S. Cl. .................. 385/113; 385/114; 385/146
(58) Field of Classification Search ........... 385/113
See application file for complete search history.

(56) References Cited

U.S. PATENT DOCUMENTS

| | | | |
|---|---|---|---|
| 4,978,187 A * | 12/1990 | Minemura et al. ............ 385/14 |
| 5,576,763 A | 11/1996 | Ackland et al. | |
| 5,694,498 A * | 12/1997 | Manasson et al. ............ 385/15 |
| 5,990,850 A | 11/1999 | Brown et al. | |
| 6,057,586 A | 5/2000 | Bawolek et al. | |
| 6,225,670 B1 | 5/2001 | Dierickx | |
| 6,235,549 B1 | 5/2001 | Bawolek et al. | |
| 6,288,434 B1 | 9/2001 | Levy | |
| 6,376,868 B1 | 4/2002 | Rhodes | |
| 6,466,266 B1 | 10/2002 | Guidash et al. | |
| 6,555,842 B1 | 4/2003 | Fossum et al. | |
| 6,570,617 B2 | 5/2003 | Fossum et al. | |
| 6,744,068 B2 | 6/2004 | Fossum et al. | |
| 2003/0103150 A1 | 6/2003 | Catrysse et al. | |
| 2003/0123827 A1 * | 7/2003 | Salerno et al. ............... 385/129 |
| 2004/0165097 A1 | 8/2004 | Drowley et al. | |

FOREIGN PATENT DOCUMENTS

| | | |
|---|---|---|
| EP | 1 213 764 A3 | 6/2002 |
| WO | WO 2004/003447 A1 | 4/2004 |

OTHER PUBLICATIONS

GB Search Report dated 6 Mar. 2006, for GB Application No. 0523264.0, corresponding to US Application No. 10/989,118.
Peter B. Catrysse et al., "Optical Efficiency of Image Sensor Pixels," Optical Society of America, vol. 19, No. 8, Aug. 2002, pp. 1610-1620.
Peter B. Catrysse et al., "Integrated Color Pixels in 0.18-um Complementary Metal Oxide Semiconductor Technology," Optical Society of America, vol. 20, No. 12, Dec. 2003, pp. 2293-2306.
Dun-Nian Yaung, et al., "Air-Gap Guard Ring for Pixel Sensitivity and Crosstalk Improvement in Deep Sub-micron CMOS Image Sensor," IEEE 2003, pp. 16.5.1-16.5.4.

* cited by examiner

*Primary Examiner*—Frank G Font
*Assistant Examiner*—Mary A El Shammaa

(57) ABSTRACT

An integrated waveguide including a dielectric structure configured to receive a first electromagnetic field distribution via a first major surface and having a second major surface, wherein the first electromagnetic field distribution produces a second electromagnetic field distribution within the dielectric structure. The waveguide further includes at least one metallic element disposed in the dielectric structure between the first major surface and the second major surface, the at least one metallic element structured and positioned to effect the second electromagnetic field distribution to increase an amount of the second electromagnetic field distribution that is incident upon a selected region of the second major surface.

8 Claims, 11 Drawing Sheets

INTEGRATED WAVEGUIDE AND METHOD FOR DESIGNING INTEGRATED WAVEGUIDE

BACKGROUND

Imaging technology is the science of converting an image to a representative signal. Imaging systems have broad applications in many fields, including commercial, consumer, industrial, medical, defense, and scientific markets. Most image sensors are silicon-based semiconductor devices that employ an array of pixels to capture light, with each pixel including some type of photodetector (e.g., a photodiode or photogate) that converts photons incident upon the photodetector to a corresponding charge. CCD (charge coupled device) and CMOS (complementary metal oxide semiconductor) image sensors are the most widely recognized and employed types of semiconductor based image sensors.

The ability of an image sensor to produce high quality images depends on the light sensitivity of the image sensor which, in-turn, depends on the quantum efficiency (QE) and optical efficiency (OE) of its pixels. Image sensors are often specified by their QE, or by their pixel QE, which is typically defined as the efficiency of a pixel's photodetector in converting photons incident upon the photodetector to an electrical charge. A pixel's QE is generally constrained by process technology (i.e., the purity of the silicon) and the type of photodetector employed (e.g., a photodiode or photogate). Regardless of the QE of a pixel, however, for light incident upon a pixel to be converted to an electrical charge, it must reach the photodetector. With this in mind, OE, as discussed herein, refers to a pixel's efficiency in transferring photons from the pixel surface to the photodetector, and is defined as a ratio of the number of photons incident upon the photodetector to the number of photons incident upon the surface of the pixel.

At least two factors can significantly influence the OE of a pixel. First, the location of a pixel within an array with respect to any imaging optics of a host device, such as the lens system of a digital camera, can influence the pixel's OE since it affects the angles at which light will be incident upon the surface of the pixel. Second, the geometric arrangement of a pixel's photodetector with respect to other elements of the pixel structure can influence the pixel's OE since such structural elements can adversely affect the propagation of light from the pixel surface to the photodetector if not properly configured. The latter is particularly true with regard to CMOS image sensors, which typically include active components, such as reset and access transistors and related interconnecting circuitry and selection circuitry within each pixel. Some types of CMOS image sensors further include amplification and analog-to-digital conversion circuitry within each pixel.

Some efforts have been made to optically model the arrangement of the photodetector with respect to other elements of the pixel structure in order to predict how incident light will travel through a pixel and thereby determine a pixel configuration that will allow the most light incident on the pixel to reach the photodetector. However, such efforts have generally relied on standard geometrical optics, such as ray tracing techniques, which do not accurately model the behavior of light at image sensor scales. This is particularly true as technology scales and pixel elements become commensurate with the wavelength of light, such as CMOS image sensors implemented in a deep sub-micron technology.

SUMMARY

In one aspect, the present invention provides an integrated waveguide. The integrated waveguide includes a dielectric structure configured to receive a first electromagnetic field distribution via a first major surface and has a second major surface, wherein the first electromagnetic field distribution produces a second electromagnetic field distribution within the dielectric structure. The waveguide further includes at least one metallic element disposed in the dielectric structure between the first major surface and the second major surface, the at least one metallic element structured and positioned to effect the second electromagnetic field distribution to increase an amount of the second electromagnetic field distribution that is incident upon a selected region of the second major surface.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following Detailed Description, therefore, is not to be taken in a limiting sense, and the scope of the present invention is defined by the appended claims.

Figure 1:
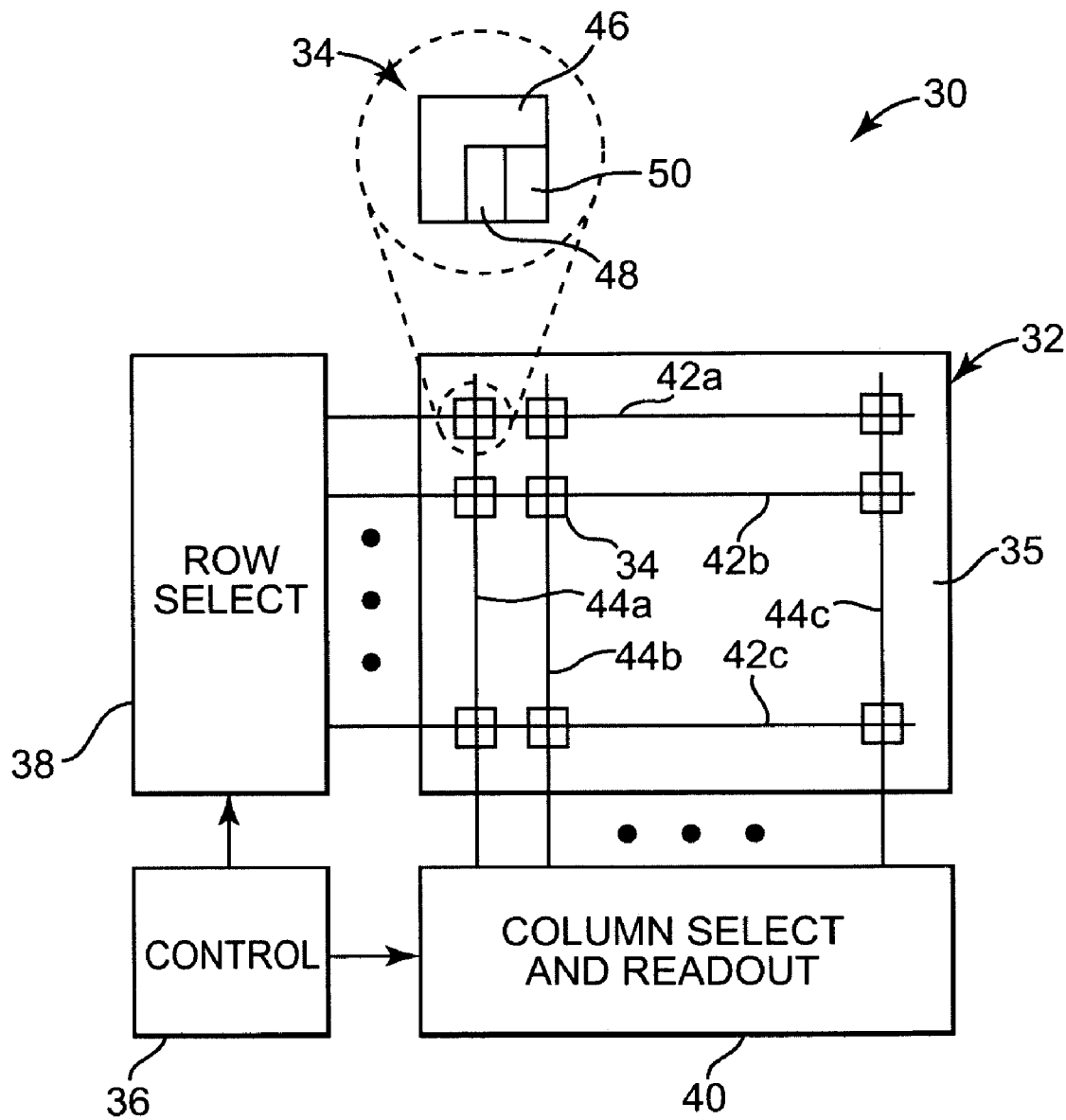
FIG. 1 is a block diagram illustrating generally one embodiment of an image sensor implemented using electromagnetic field simulation techniques according to the present invention.

FIG. 1 is a block diagram illustrating generally one embodiment of a complementary metal oxide semiconductor (CMOS) active pixel image sensor (APS) 30 including a focal plane array 32 of pixels 34 formed on a silicon substrate 35 and implemented based on electromagnetic field simulation techniques. APS 30 includes controller 36, row select circuit 38, and column select and readout circuit 40. Array 32 is arranged in a plurality of rows and columns, with each row of pixels 34 coupled to row select circuit 38 via row signal buses 42 and each column of pixels 34 coupled to column select and readout circuit 40 via output lines 44. As illustrated generally by FIG. 1, each pixel 34 includes a photodetector 46, a charge transfer section 48, and a readout circuit 50. Photodetector 46 comprises a means for converting incident photons to electrons such as, for example, a photodiode or a photogate.

CMOS image sensor 30 is operated by controller 36, which controls readout of charges accumulated by pixels 34 during an integration period by respectively selecting and activating appropriate row signal lines 42 and output lines 44 via row select circuit 38 and column select and readout circuit 40. Typically, the readout of pixels 34 is carried out one row at a time. In this regard, all pixels 34 of a selected row are simultaneously activated by its corresponding row signal line 42, and the accumulated charges of pixels 34 from the activated row read by column select and readout circuit 40 by activating output lines 44.

Figure 2A:
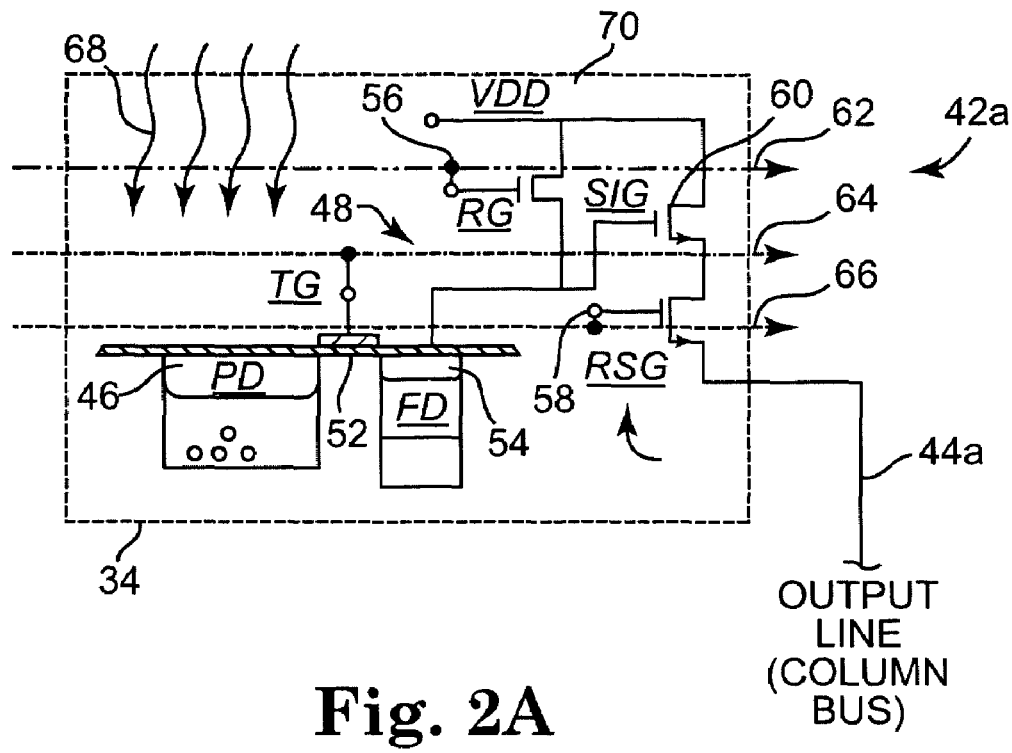
FIG. 2A is a block and schematic diagram illustrating generally one embodiment of an active pixel sensor.

FIG. 2A is a block and schematic diagram illustrating generally one embodiment of an APS, such as APS 34 of FIG. 1. APS 34 includes photodetector 46, charge transfer section 48, and readout circuit 50. Charge transfer section 48 further includes a transfer gate 52 (sometimes referred to as an access transistor), a floating diffusion region 54, and a reset transistor 56. Readout circuit 50 further includes a row select transistor 58 and a source follower transistor 60.

Controller 36 causes APS 34 to operate is two modes, integration and readout, by providing reset, access, and row select signals via row signal bus 42a which, as illustrated, comprises a separate reset signal bus 62, access signal bus 64, and row select signal bus 66. Although only one pixel 34 is illustrated, row signal buses 62, 64, and 66 extend across all pixels of a given row, and each row of pixels 34 of image sensor 30 has its own corresponding set of row signal buses 62, 64, and 66. Pixel 34 is initially in a reset state, with transfer gate 52 and reset gate 56 turned on. To begin integrating, reset transistor 56 and transfer gate 52 after turned off. During the integration period, photodetector 46 accumulates a photo-generated charge that is proportional to the portion of photon flux 62 incident upon pixel 34 that propagates internally through portions of pixel 34 and is incident upon photodetector 46. The amount of charge accumulated is representative of the intensity of light striking photodetector 46.

After pixel 34 has integrated for a desired period, row select transistor 58 is turned on and floating diffusion region 54 is reset to a level approximately equal to VDD 70 by via control of reset transistor 56. The reset level is then sampled by column select and readout circuit 40 via source-follower transistor 60 and output line 44a. Subsequently, transfer gate 52 is turned on and the accumulated charge is transferred from photodetector 42 to floating diffusion region 54. The charge transfer causes the potential of floating diffusion region 54 to deviate from its reset value, approximately VDD 70, to a signal value which is dictated by the accumulated photogenerated charge. The signal value is then sampled by column select and readout circuit 40 via source-follower transistor 60 and output line 44a. The difference between the signal value and reset value is proportional to the intensity of the light incident upon photodetector 46 and constitutes an image signal.

Figure 2B:
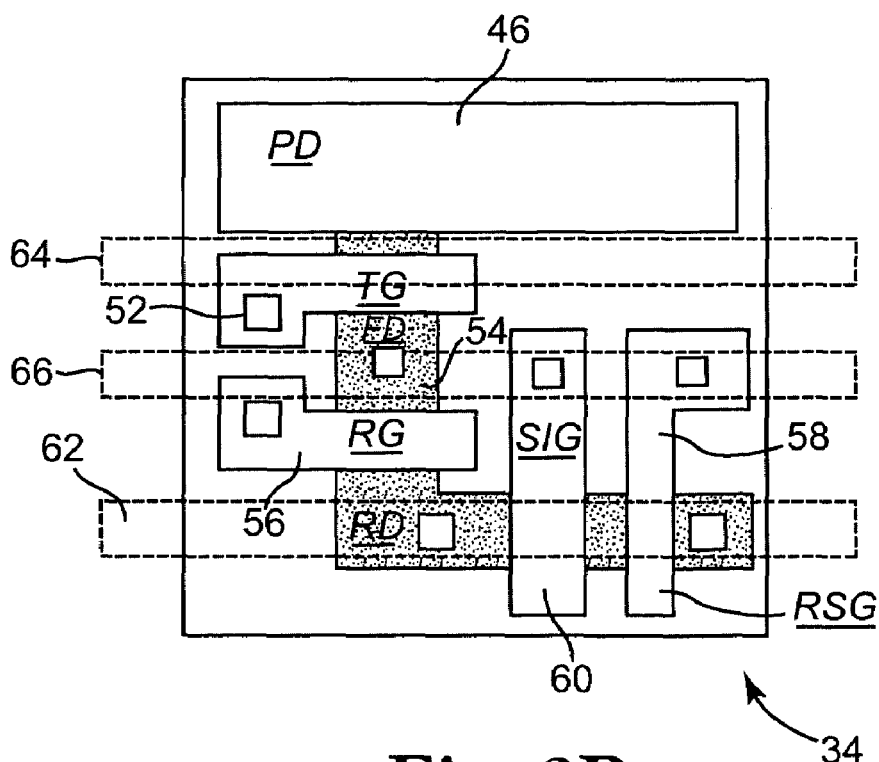
FIG. 2B illustrates an example layout of the active pixel sensor of FIG. 2A.

FIG. 2B is an illustrative example of a conventional layout of APS 34 illustrated by FIG. 2A. Pixel control elements (i.e. reset transistor 56, row select transistor 58, source-follower transistor 60) and related interconnect circuitry (i.e., signal buses 62, 64, 66 and related transistor connections) are generally implemented in metallic layers that overlay a silicon substrate in which photodetector 46 is located. Although other layout designs are possible, it is evident that the pixel control elements and related interconnect circuitry consume a great deal of space within APS 34 regardless of the layout design. Such space consumption is even greater in digital pixel sensors (DPS's), which include analog-to-digital conversion means within each pixel.

Figure 3:
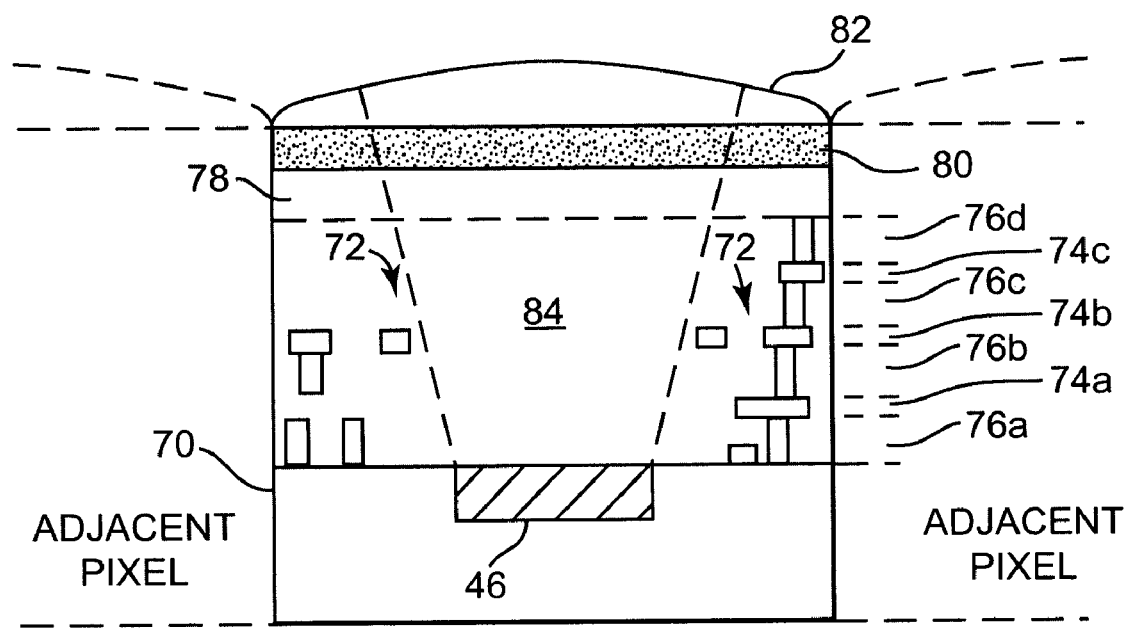
FIG. 3 is an illustrative example of a cross section through an active pixel sensor.

FIG. 3 is an illustrative example of a cross section through a conventional CMOS pixel, such as APS 34. Photodetector 46 is located in a silicon (Si) substrate 70 that forms the pixel floor. The pixel control elements and related interconnect circuitry are illustrated generally at 72 and are located in multiple metal layers 74 separated by multiple dielectric insulation layers ($SiO_2$) 76. Vertical interconnect stubs, or vias, 78, electrically connect elements located in different metal layers 74. A dielectric passivation layer 78 is located over the alternating metal layers 74 and dielectric insulation layers 76. A color filter layer 80 (e.g. red, green, or blue of a Bayer pattern) comprising a resist material is located over passivation layer 78. To improve light sensitivity, a domed microlens 82 comprising a dielectric material (e.g., SiO2) is commonly deposited over the pixel to redirect incident light upon the pixel toward photodetector 46. Microlens 82 can effectively increase a pixel's "fill factor," which is typically defined as a ratio of the light sensitive area to the total area of a pixel, by improving the angles at which incident photons strike the photodetector. Together, the above described elements of the pixel are hereinafter collectively referred to as the pixel structure.

As previously described, the light sensitivity of a pixel is influenced by the geometric arrangement of the photodetector with respect to other elements of the pixel structure, as such structure can affect the propagation of light from the surface of the pixel to the photodetector (i.e., the optical efficiency). In fact, the size and shape of the photodetector, the distance from the photodetector to the pixel's surface, and the arrangement of the control and interconnect circuitry relative to the photodetector can all impact a pixel's OE.

Conventionally, in efforts to maximize pixel light sensitivity, image sensor designers have intuitively attempted to keep the area of the pixel between the photodetector and microlens free of metal interconnects so that light is not "blocked" by such obstacles. As such, designers typically create an optical path 84, or light cone, between the photodetector and microlens which is based on geometrical optics. Optical path 84 does not contain metal, but comprises only the dielectric passivation layer 78 and multiple dielectric insulation layers 76. Although illustrated as being conical in nature, the optical path 84 may have other forms as well. However, regardless of the form of optical path 84, as technology scales to smaller feature sizes, such an approach becomes increasingly difficult to implement, and the effect of a pixel's structure on the propagation of light is likely to increase.

Efforts have been made to optically model pixel structures and incident light in order to simulate how a pixel's structure will affect the optical path of incident light through the pixel. One approach has been to extend the use of geometrical ray tracing techniques (e.g., Zemax®), which are generally used for modeling imaging lenses that are positioned in front of an image sensor, such as the lens of a digital camera. With this "geometrical" approach, the refractive characteristics of the microlens are modeled, and small "obstacles" having certain reflective properties are employed to represent pixel control elements and interconnects and are placed between the microlens a plane representative of the photodetector. Rays representative of incident light are then "traced" to predict its optical path through the pixel. The results of this approach generally indicate that such obstacles will simply produce substantially geometric shadows at the photodetector plane.

While the geometric approach may be adequate for modeling imaging lenses, it does not model electromagnetic interaction between the incident light and the metallic elements of the pixel structure. Such electromagnetic interaction significantly influences the propagation of light in pixels, particularly as technology scales and pixel elements become commensurate with the wavelength of light, as with CMOS image sensors implemented in a deep sub-micron technology. At such scales, the electromagnetic cross-section of a sub-wavelength metallic element, such as an interconnect wire, is different from its geometric profile.

Another modeling approach, referred to as the Phase Space (PS) approach, is based on scalar diffraction theory, which describes light as a field rather than a ray. However, while the PS approach provides a more accurate description of the wave-nature of light than the above described geometric approach, it does not take into account the vector nature of light. The PS approach is based on a scalar theory and disregards either the electric or magnetic field component. The PS approach assumes that the fields components do not interact, and that either one of the field components appropriately describes the light. Exemplary teachings on the PS approach can be found in the following publication: Peter B. Catrysse and Brian A. Wandell, "Optical efficiency of image sensor pixels", J. Opt. Soc. Am. A, August 2002, Vol. 19, No. 8, pp. 1610-1620.

Figure 4:
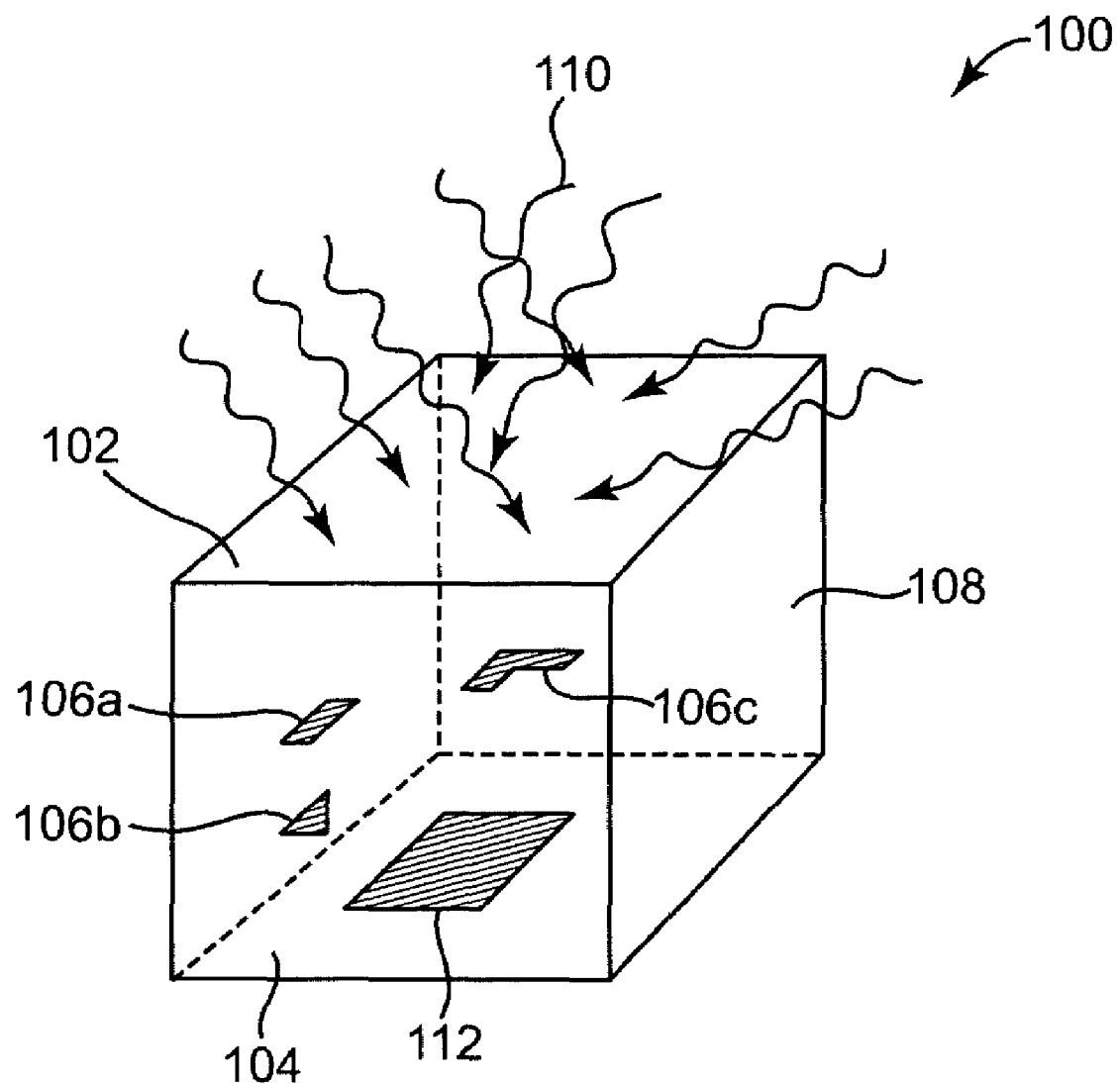
FIG. 4 is a schematic diagram illustrating one embodiment of an integrated waveguide according to the present invention.

FIG. 4 is a block diagram illustrating one embodiment of an integrated waveguide 100 according to the present invention. Integrated waveguide 100 is implemented using electromagnetic field simulation techniques, which simulate electromagnetic filed distributions generated by interactions between incident light and the structure of the integrated waveguide. The electromagnetic field simulation techniques are discussed in greater detail below.

Integrated waveguide 100 includes a first surface 102, a second surface 104, and a plurality of metallic elements 106 disposed in a dielectric structure 108 between first surface 102 and second surface 104. Integrated waveguide 100 is configured to receive a first electromagnetic field distribution 110 via first surface 102 that produces a second electromagnetic field distribution within dielectric structure 108. Metallic elements 106 are structured and positioned to effect the second electromagnetic field distribution to increase an amount of the second electromagnetic field distribution that is incident upon a selected region of second surface 104. In one embodiment, as illustrated, electromagnetic field distribution 110 comprises one or more wavelengths of visible light at one or more angles of incidence with first surface 102 and with one or more polarizations. As such, in one embodiment, metallic elements 106 are structured and positioned to redirect to selected region 112 a selected portion of light 110 that would otherwise not be incident upon selected region 112.

In one embodiment, the selected portion of the light 110 incident upon first surface 102 redirected by metallic elements 106 comprises light having a given wavelength, for example, 550 nanometers (i.e., green light). In one embodiment, the selected portion of light 110 comprises light generally within a given range of wavelengths, for example, 525 nanometers to 575 nanometers. In one embodiment, the selected portion of light 110 redirected by metallic elements 106 comprises light having a given angle of incidence with first surface 102. In one embodiment, the selected portion of light 110 redirected by metallic elements 106 comprises light within a given range of incident angles.

In one embodiment, as illustrated, metallic elements 106 are formed to have desired geometric shapes and are positioned vertically and horizontally between first surface 102 and second surface 104 and relative to both one another and desired region 112 so as to form a desired electromagnetic field distribution. Also, while integrated waveguide 100 is illustrated generally as a cube in FIG. 4, dielectric waveguide 100 can be configured in any number of three-dimensional shapes (e.g., cylindrical, conical, etc.).

Figure 5:
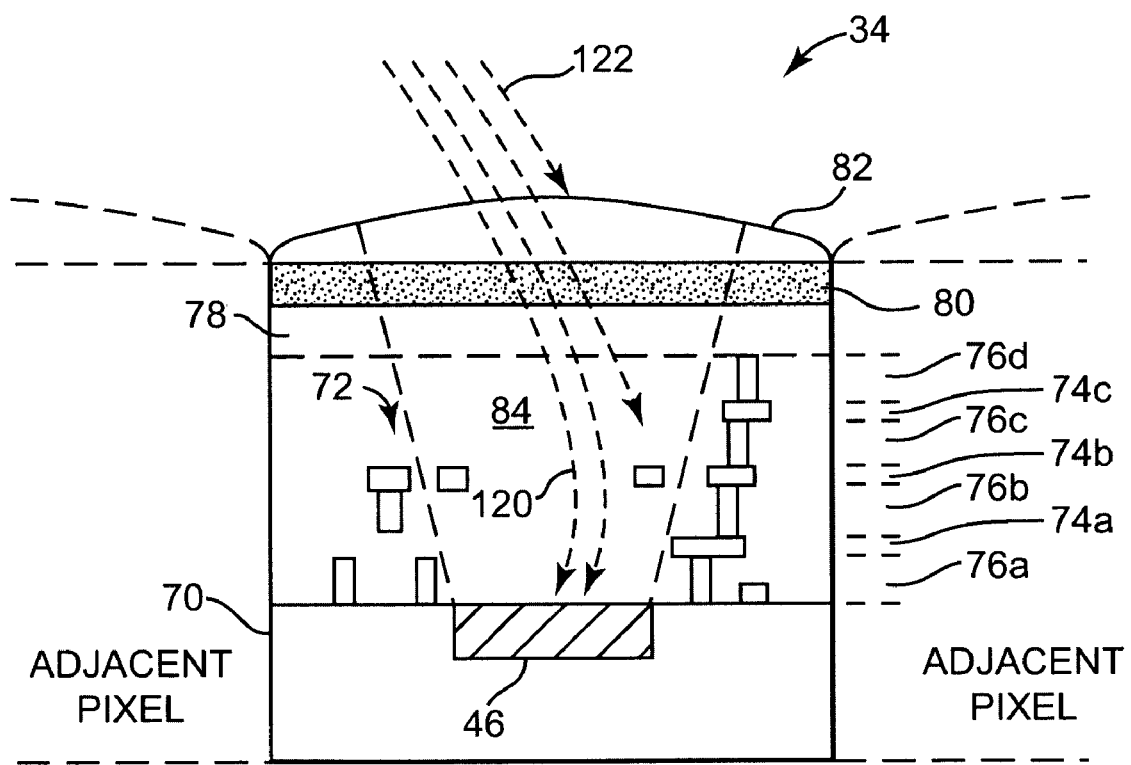
FIG. 5 is an illustrative example of a cross section through an active pixel sensor having a structure configured to form an integrated waveguide.

FIG. 5 is a cross section illustrating of one embodiment of a pixel according to the present invention, such as APS 34, wherein pixel control elements and interconnect circuitry 72 are positioned within APS 34 so as to form an integrated waveguide to improve the pixel's optical efficiency. Contrary to conventional wisdom, pixel control elements and interconnect circuitry 72 are located in close proximity to photodetector 46. In fact, in one embodiment, as illustrated, a portion of the pixel control elements and interconnect circuitry is positioned within what would conventionally be metal-free optical path 84. Pixel control elements and interconnect circuitry 72 are structured and positioned between the photodetector 46 and microlens 82 to form an electromagnetic field distribution that selectively redirects to photodetector 46 at least a portion 120 of the light 122 incident upon microlens 82 that would otherwise be non-incident with photodetector 46. By positioning pixel control elements and interconnect circuitry 72 to form a integrated waveguide through dielectric and metal layers 74 and 76 that redirects light 120 to photodetector 46, the optical efficiency of APS 34 is improved.

Figure 6:
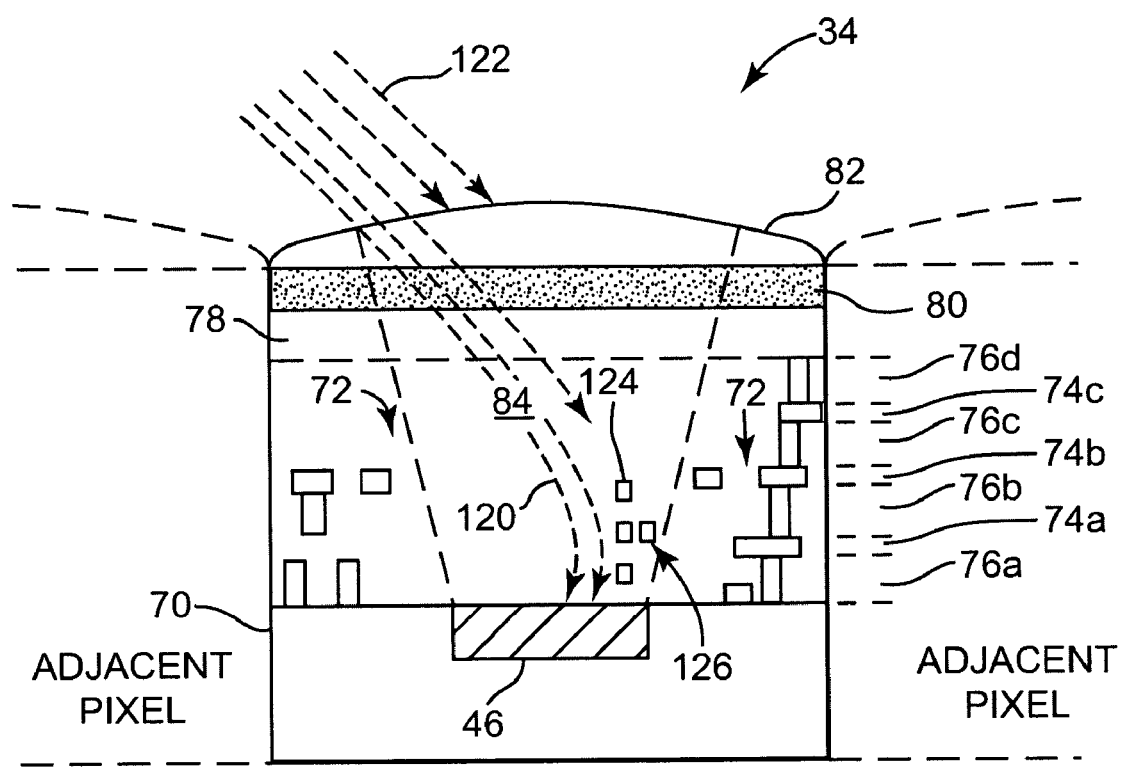
FIG. 6 is an illustrative example of a cross section through an active pixel sensor having a structure configured to form an integrated waveguide.

FIG. 6 is a cross section illustrating another embodiment of a pixel, such as APS 34, implemented using integrated waveguide techniques according to the present invention. As illustrated, a plurality metallic elements 94 (four are illustrated), which are electrically isolated from one another and from the pixel control elements and interconnect circuitry 72, are disposed in what would conventionally be metal-free optical path 84 between photodetector 46 and microlens 82. The electrical elements 124 are structured and positioned with respect to one another and to photodetector 46 to form an electromagnetic antenna 126 that forms an electromagnetic field distribution that selectively redirects to photodetector 46 a portion 120 of the light 122 incident upon microlens 82 that would otherwise be non-incident with photodetector 46. Again, contrary to the conventional wisdom of keeping the optical path clear of "obstructions", positioning electromagnetic antenna 126 to form an integrated waveguide through dielectric and metal layers 74 and 76 improves the optical efficiency of APS 34 by redirecting light 120 to photodetector 46. In one embodiment, metallic elements 124 are not electrically isolated from pixel control elements and interconnect circuitry 72, but comprise non-current carrying appendages from pixel control elements and interconnect circuitry 72.

Although described primarily with regard to CMOS technologies, it must be noted that the electromagnetic field simulation techniques according to the present invention and described herein apply equally as well to other types of solid state image sensors, such as CCD type image sensors.

Figure 7:
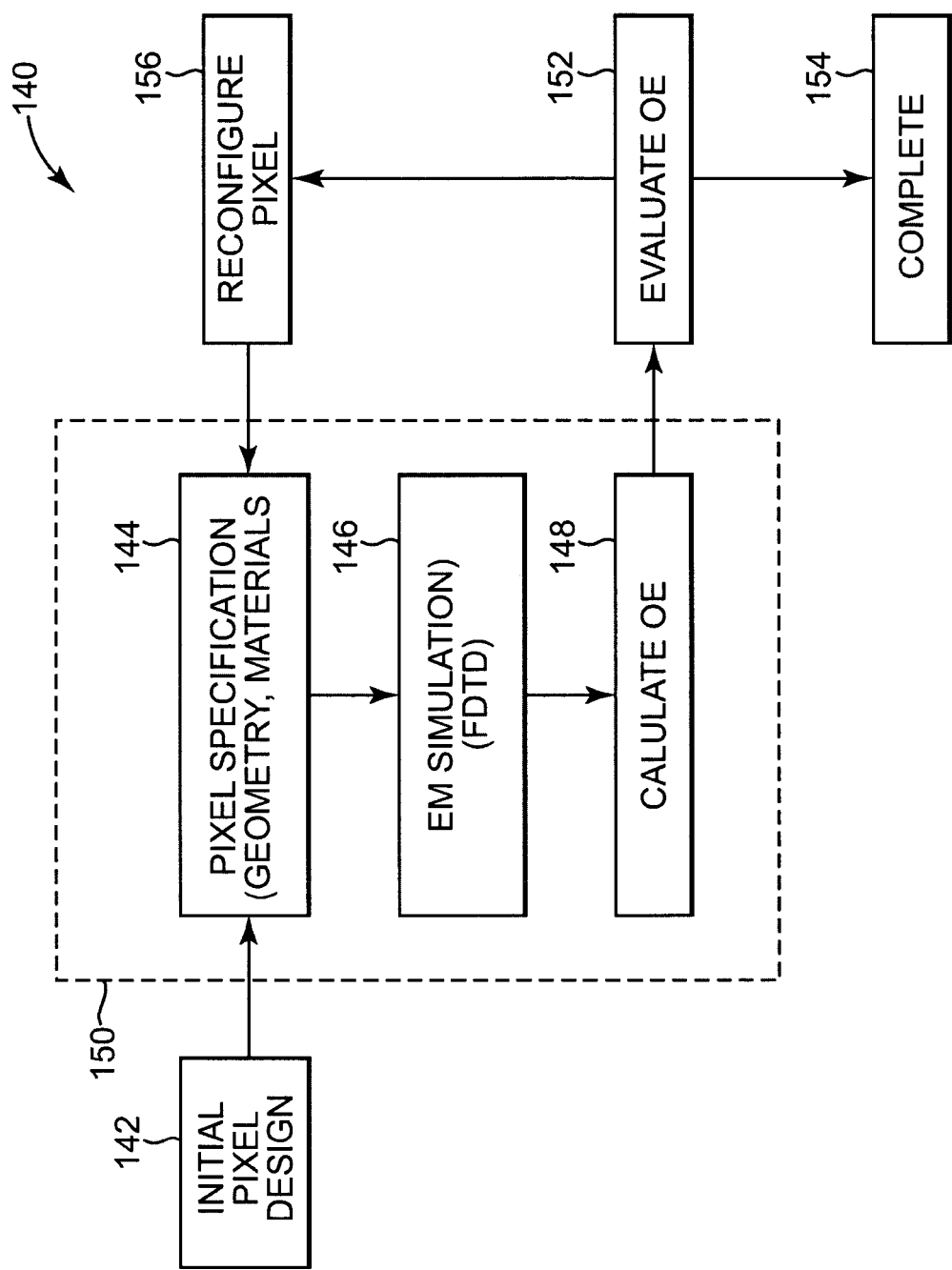
FIG. 7 is a flow diagram illustrating one embodiment of a process for determining a pixel configuration that optimizes optical efficiency of the pixel.

FIG. 7 is a flow diagram illustrating one embodiment of a process 140 employing electromagnetic field simulation techniques to determine a pixel configuration that improves or substantially optimizes the optical efficiency of the pixel. Process 140 begins at step 142, wherein an initial configuration or layout of the structure of a proposed pixel is determined, such as the layout of APS 34 illustrated by FIG. 2A and FIG. 2B. Steps 144, 146, and 148 are related to and/or performed by an electromagnetic field simulation tool, as indicated at 150.

Electromagnetic field simulation tool (EFST) 150 comprises a numerical method for solving and simulating electromagnetic problems. There are several know methods for performing such simulations, including the finite element method (FEM), the finite-difference frequency-domain method (FDFD), and the finite-difference time-domain method (FDTD). While original software code may be developed to implement such an electromagnetic field simulation tool, there are several commercial products available. One such commercial product found to be particularly suitable is OptiFDTD® from Optiwave Corporation of Ottawa, Canada. As its name implies, the OptiFDTD® product employs the finite-difference time-domain method for performing electromagnetic field simulations. Hereinafter within this specification, references to EFST 150 are made with regard to the OptiFDTD® simulation tool.

At step 144, data required to perform a simulation is entered into EFST 150. A three-dimensional geometric model of the initial pixel structure from step 142 is entered into EFST 150. In addition to geometrically modeling the pixel, material properties of each component of the pixel structure are entered at step 144. The FDTD method basically models three types of materials: permanent dipole materials, such as water, dielectric materials, and conductive materials. There are a multitude of known models that can be employed for describing the properties of such materials, such as the Drude model for materials for conductive materials, and the Lorentz model for lossy dielectric materials. The method, manner, and techniques used for modeling the geometry and material properties of the pixel structure may vary depending on the particular EFST used. Additionally, data representative of a selected type of light source (an excitation input) which is to be simulated as being incident upon the proposed pixel is entered at step 144. Depending upon the EFST employed, various characteristics of the incident light can be modeled, such as whether the light source is a continuous wave source or a pulsed source, the center wavelength, the angle of incidence between the light source and the pixel structure, and amplitude. Lastly, a planar observation area/volume representative of the pixel's photodetector is defined for the proposed pixel configuration.

At step 146, EFST 150 performs an electromagnetic field simulation for a selected time duration for the pixel configuration, material properties, selected incident light source, and photodetector area entered at step 144. EFST 150 simulates the electromagnetic field propagation of the selected incident light source through the modeled pixel structure by calculating the electric and magnetic fields versus time according to the FDTD method.

At step 148, EFST 150 calculates the OE (optical efficiency) of the modeled pixel from the electric and magnetic field data acquired during the simulation of step 146. As described above, OE is a ratio of the spectral irradiance incident upon the pixel's surface to the spectral irradiance incident upon the pixel's photodetector, and is a spectral quantity that varies with wavelength. Spectral irradiance is defined as optical power received per unit area per wavelength. EFST 150, using the FDTD method, determines OE by calculating from the acquired electric and magnetic field data a Poynting vector at the input plane and a Poynting vector at the photodetector plane. The ratio of these Poynting vectors comprises OE for the modeled pixel. A more detailed discussion of the above described method of calculating OE can be found in the following publication: Peter B. Catrysse and Brian A. Wandell, "Integrated color pixels in 0.18-μm complementary metal oxide semiconductor technology", J. Opt. Soc. Am. A, December 2003, Vol. 20, No. 12, pp. 2293-2306.

In one embodiment, after calculating OE, process 140 proceeds to step 152, wherein the calculated OE is evaluated. If the calculated OE is at or above a desired value, the configuration of the modeled pixel is deemed to acceptable and process 140 is completed, as indicated at 154. If the calculated OE is below the desired value, the geometric layout of the pixel structure is reconfigured at step 156. Such a reconfiguration can simply involve repositioning selected components of the pixel structure relative to the photodetector, or can involve adding projections from required pixel structure or adding metallic elements that are electrically isolated from the required pixel structure. In one embodiment, the material properties can also be adjusted to simulate the use of alternate materials for select system components and isolated metallic elements.

The geometry and/or material properties of the reconfigured pixel are entered into EFST 150 at step 144. The EFST 150 performs an electromagnetic field simulation and OE calculation for the reconfigured pixel at steps 146 and 148. The calculated OE is evaluated at step 152, and the above process repeated until a pixel configuration having a calculated OE above the desired value is determined. By employing process 140 as described above, a pixel layout having a desired OE can be designed and simulated prior to its actual fabrication.

Figure 8A:
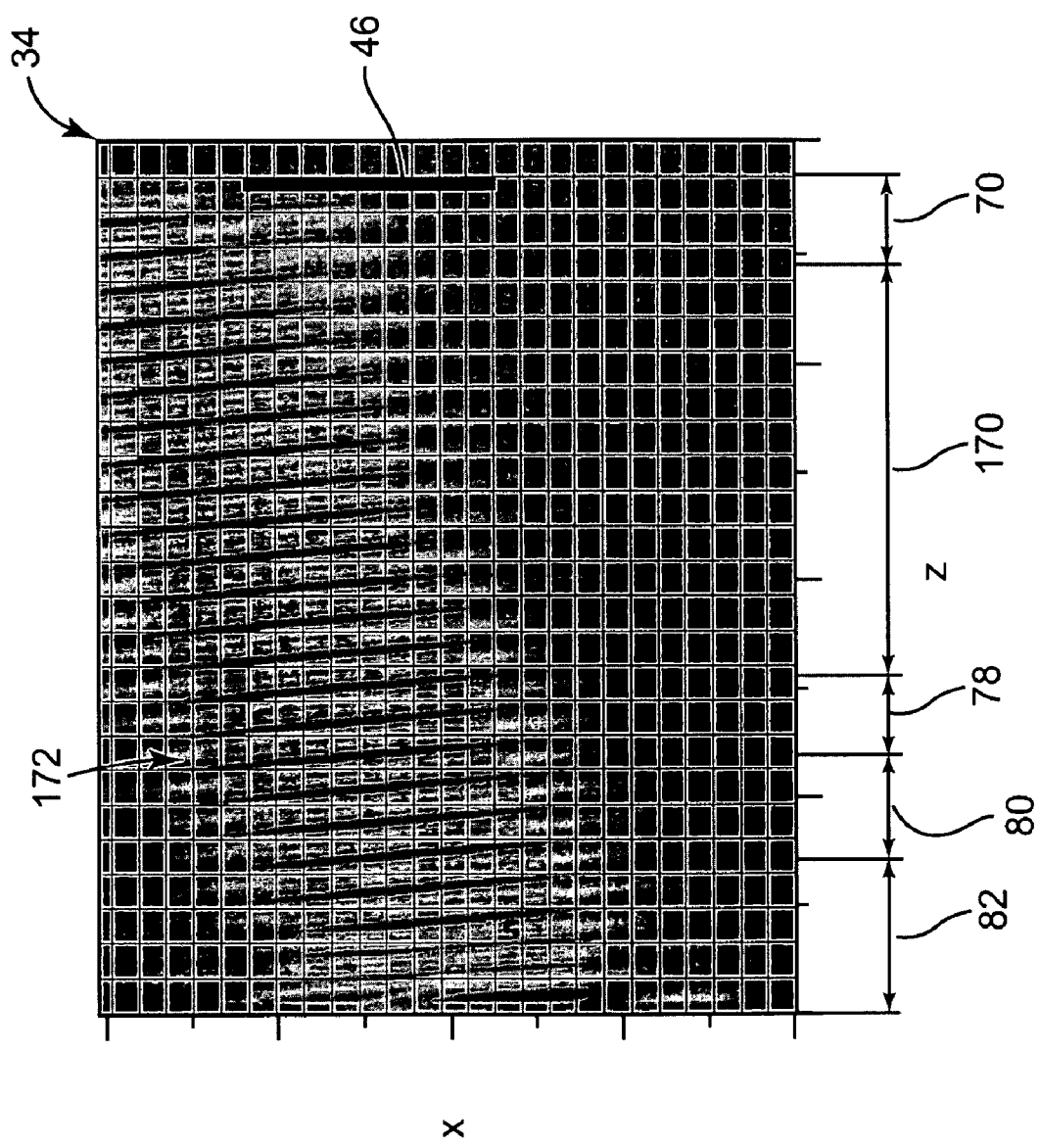
FIG. 8A illustrates the simulated propagation of incident light through an example pixel using electromagnetic field simulation techniques.
Figure 8B:
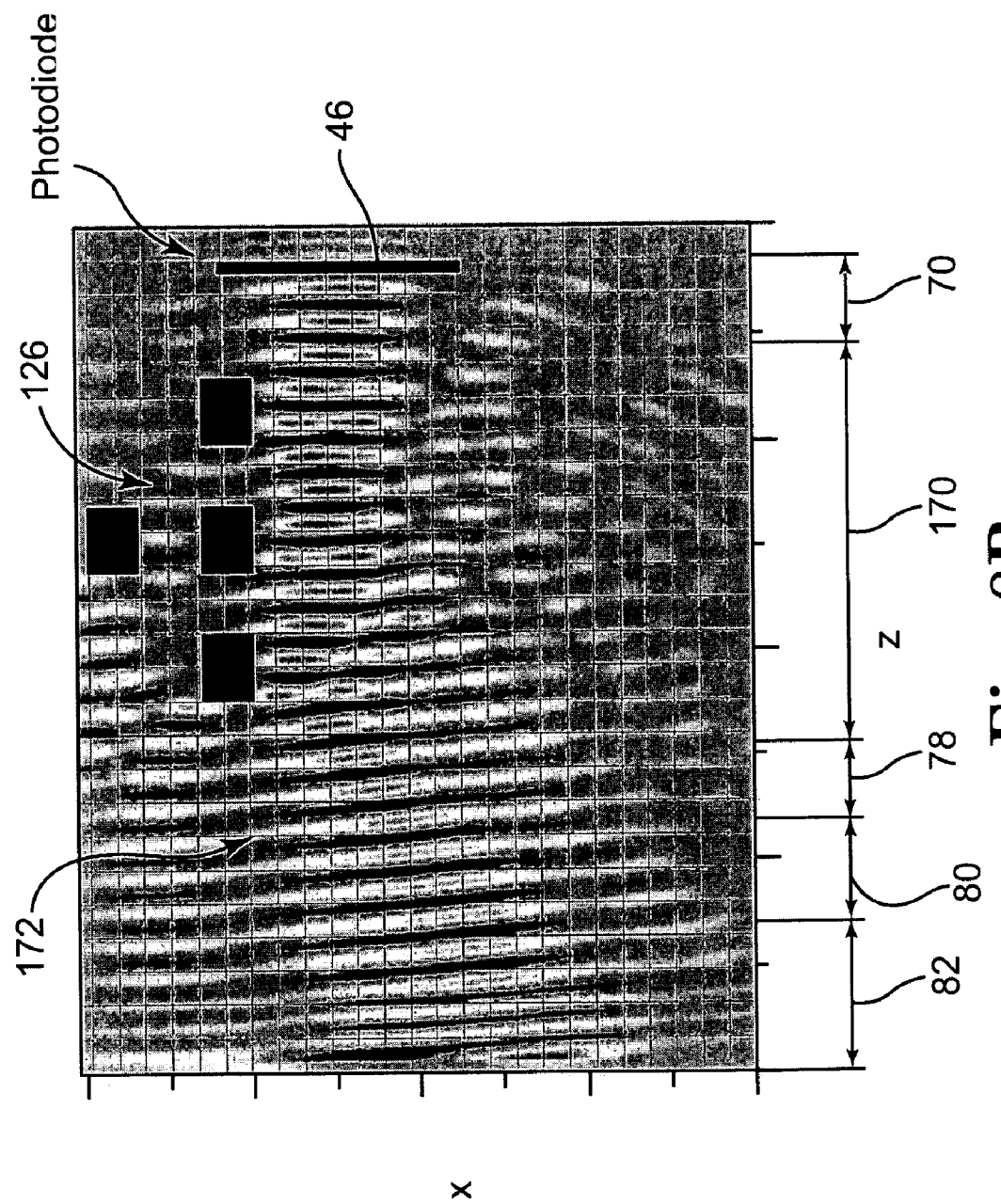
FIG. 8B illustrates the simulated propagation of incident light through an example pixel using electromagnetic field simulation techniques.

FIG. 8A and FIG. 8B are graphical outputs provided by the OptiFDTD® tool which illustrate the simulated propagation of incident light through modeled pixel structures. FIG. 7A and FIG. 7B illustrate example simulations based on electromagnetic field simulations according to the present invention that demonstrate the effect of metallic elements, or wires, on the propagation of incident light through a pixel.

FIG. 8A illustrates the simulated propagation of incident light 172 through a vertical plane from the pixel surface to the photodetector (i.e., a vertical cross-section) of an example pixel having no metallic elements in the optical path, similar to APS 34 as illustrated by FIG. 3. As such, the simulated pixel includes microlens layer 82, color filter layer 80, passivation layer 78, alternating metal and insulating layers 74 and 76, indicated collectively as layer 170, and photodetector 46 in silicon substrate 70. In this simulation, incident light 172 comprises a continuous light source (as opposed to pulse source) that strikes the microlens layer 82 at an oblique incident light. As oblique incident light 172 travels through the pixel from microlens layer 82 generally toward silicon substrate 70, it is evident that a large portion of incident light 172 is not incident upon photodetector 46.

FIG. 8B illustrates the simulated propagation of oblique incident light 172 through the same pixel employed for the simulation of FIG. 8A, except that the pixel is modeled to further include electrically isolated electromagnetic antenna 126 positioned between photodetector 46 and microlens layer 82, similar to APS 34 as illustrated by FIG. 6. In this simulation, as oblique incident light 172 travels through APS 34, electromagnetic interaction with electromagnetic antenna 126 redirects to photodetector 46 at least a portion of incident light 132 that would otherwise be non-incident upon photodetector 46. As such, against conventional wisdom, placing electromagnetic antenna 126 in close proximity to photodetector 46 and within optical path 84 can increase the optical efficiency of APS 34 as compared to the keeping dielectric tunnel free of metallic elements.

The electromagnetic simulation techniques for calculating and improving the optical efficiency of a pixel described above in reference to FIG. 7 can be extended to improve and/or optimize other objective, or measurable, criteria associated with pixel performance. Such performance criteria include pixel response, pixel color response (R,G,B response), and pixel cross-talk.

Pixel response is defined as the amount of charge integrated by a pixel's photodetector during a defined integration period. Pixel response can be expressed by the following Equation I:

$$C_1 = AT \int OE(\lambda) QE(\lambda) E_{D65}(\lambda) d\lambda; \text{ where:} \quad \text{Equation I}$$

$C_1$=pixel response;
A=photodetector area;
T=integration period;
$OE(\lambda)$=wavelength dependent function of the optical efficiency (as calculated at step 148 in FIG. 7);
$QE(\lambda)$=wavelength dependent function of the quantum efficiency of the photodetector; and
$E_{D65}$=standard wavelength dependent function representative of daylight (equivalent color temperature 6500° K.).

To calculate pixel response, $C_1$, Equation I is integrated over a wavelength range, e.g., 400-700 nanometers. The higher the value of $C_1$, the better the pixel's response. While Equation I above employs the standardized function $E_{D65}$, which is representative of daylight illumination, wavelength dependent functions of other light sources, such as a function representative of a fluorescent or tungsten light source, could also be employed. The $E_{D65}$ function is illustrated in Equation I, as it represents a standard light source typically employed when testing optical devices.

Pixel arrays of color image sensors, such as pixel array 32 illustrated by FIG. 1, are often typically configured such that each pixel of the array is assigned to sense a separate primary color. Such an assignment is made by placing a color filter array over the pixel array, with each pixel having an associated filter comprising corresponding to its assigned primary color. Such a color filter is illustrated by color filter layer 80 of APS 34 of FIG. 3. As light passes through the color filter, only wavelengths of the assigned primary color will pass through. Many color filter arrays have been developed, but one commonly used color filter array is the Bayer pattern. The Bayer pattern employs alternating rows of red pixels wedged between green pixels, and blue pixels wedged between green pixels. As such, the Bayer pattern has twice as many green pixels as red pixels or blue pixels. The Bayer pattern takes advantage of the human eye's predilection to see green illuminance as the strongest influence in defining sharpness, and a pixel array employing the Bayer pattern provides substantially equal image sensing response whether the array is orientated horizontally or vertically.

When laying out a pixel that is configured to sense a certain wavelength or range of wavelengths, such as a pixel comprising a portion of a pixel array arranged according to the Bayer pattern which is assigned to sense green, blue, or red, it is beneficial to be able to determine the pixel's response to its assigned color. A pixel's color response for a selected color can be expressed by the following Equation II:

$$C_2 = \int OE_X(\lambda) QE(\lambda) E_{D65}(\lambda) d\lambda; \text{ where:} \quad \text{Equation II}$$

$C_2$=pixel response for a selected color, X.
$OE_X(\lambda)$=wavelength dependent function of the optical efficiency for a selected color or wavelength, X (such as red, green, or blue);
$QE(\lambda)$=wavelength dependent function of the quantum efficiency of the photodetector; and
$E_{D65}$=standard wavelength dependent function representative of daylight (equivalent color temperature 6500° K.).

To calculate the pixel color response, $C_2$, for the desired color, X, Equation II is integrated over a range of wavelengths, such as from 400 to 700 nanometers, which is representative of the visible spectrum. The higher the value of $C_2$, the better the pixel's color response. Equation II also employs the standardized light source function $E_{D65}$, but could also employ other wavelength dependent functions for other light sources, such as a function representative of a fluorescent light source.

In a color image sensor, the term "pixel cross-talk" generally refers to a portion or amount of a pixel's response that is attributable to light incident upon the pixel's photodetector that has a color (i.e., wavelength) other than the pixel's assigned color. Such cross-talk is undesirable as it distorts the amount of charge collected by the pixel in response to its assigned color. For example, light from the red and/or blue portion of the visible spectrum that impacts the photodetector of a "green" pixel will cause the pixel to collect a charge that is higher than would otherwise be collected if only light from the green portion of the visible spectrum impacted the photodetector. Such cross-talk can produce distortions, or artifacts, and thus reduce the quality of a sensed image. The cross-talk for a pixel can be expressed by the following Equation III:

Equation III:

$$C_3 = \frac{\int_{\lambda \in G} OE_G(\lambda) QE(\lambda) E_{D65}(\lambda) d\lambda}{\int_{\lambda \in G} OE_{R,B}(\lambda) QE(\lambda) E_{D65}(\lambda) d\lambda}; \text{ where}$$

$C_3$=pixel crosstalk;
$OE_G(\lambda)$=wavelength dependent function of the optical efficiency for green light;
$OE_{R,B}(\lambda)$=wavelength dependent function of the optical efficiency for a red and blue light;
$QE(\lambda)$=wavelength dependent function of the quantum efficiency of the photodetector;
$E_{D65}$=standard wavelength dependent function representative of daylight (equivalent color temperature of 6500° K.); and
$\lambda \in G$=indicates integration over a range of wavelengths representative of the green portion of the visible spectrum.

Equation III, as shown, illustrates the calculation of pixel cross-talk for a green pixel. As such, the numerator represents the pixel response for light in the green portion of the visible spectrum while the denominator represents the combined pixel response for light in the red and blue portions of the visible spectrum. The higher the value for $C_3$, the less cross-talk there is at the pixel. Although the specific illustration illustrates the calculation of pixel cross-talk for a green pixel, Equation III can be readily modified to express cross-talk for red and blue pixels as well.

Figure 9:
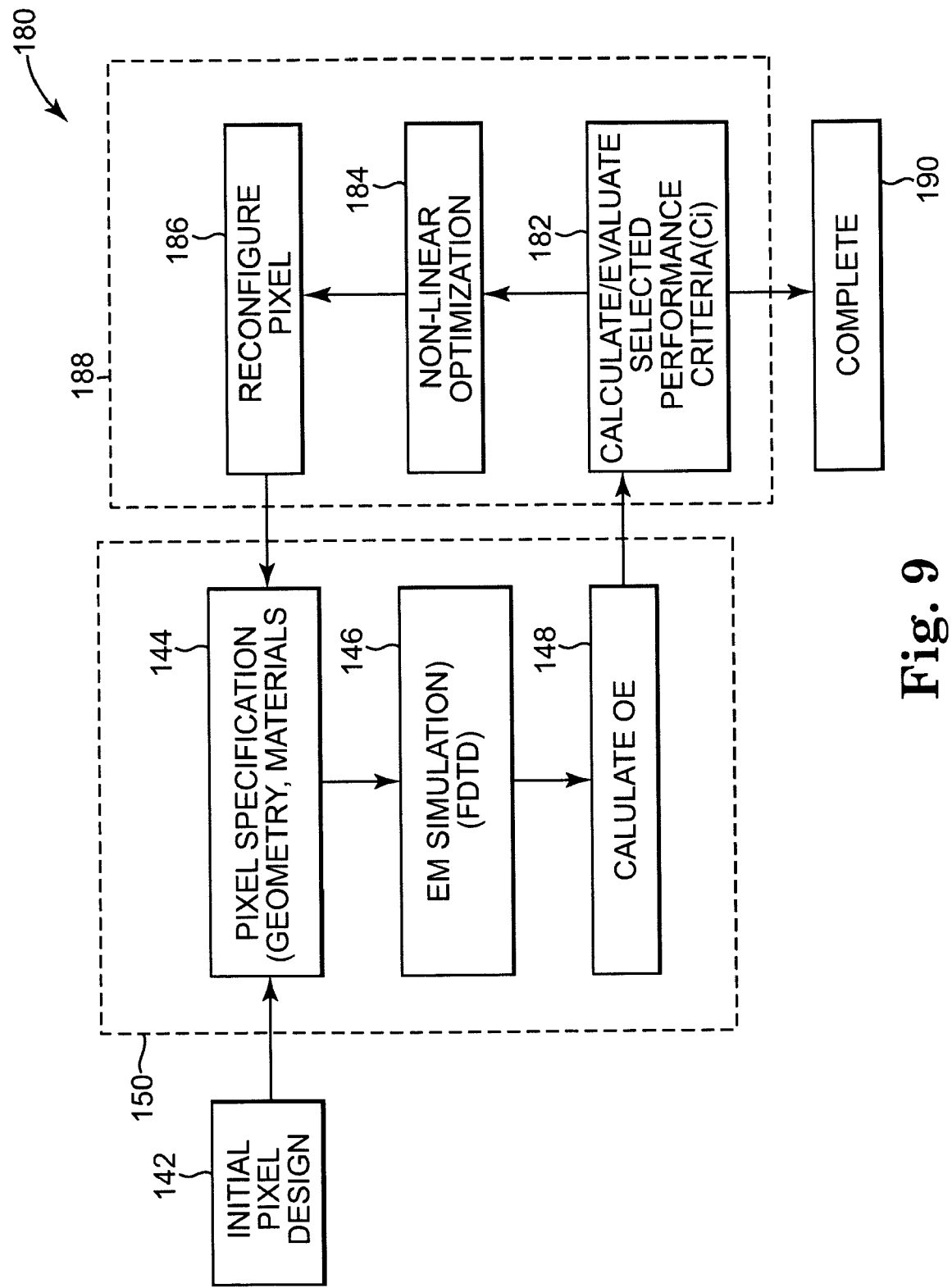
FIG. 9 is a flow diagram illustrating one embodiment of a process for determining a pixel configuration that optimizes selected pixel performance criteria.

Equations I, II, and III illustrate specific examples of OE-dependent criteria associated with pixel performance. In addition to these specific examples, there are a multitude of other OE-dependent performance criteria associated with a pixel. FIG. 9 is a flow diagram illustrating one embodiment of a process 180 employing electromagnetic field simulation to determine a pixel configuration that substantially optimizes a selected performance criteria of the pixel, such the performance criteria illustrated above by Equations I, II, and III.

The initial four steps of process 180, beginning with step 142, are the same as the initial four steps of process 140 to calculate OE as illustrated by FIG. 7. Steps 182, 184, and 186 are performed by a computation code (CC) 188. While original computation code may be developed, there are several commercially available computation codes. One suitable computation code is MATLAB 6.5® available from The Math Works, Inc.

At step 182, CC 188 receives the calculated OE from EFST 150 and computes a selected performance criteria ($C_i$) using a corresponding OE-dependent function. The selected performance criteria may include pixel response ($C_1$), pixel color response ($C_2$), and pixel cross-talk ($C_3$) expressed by the OE-dependent functions respectively described by Equations I, II, and III. If the currently computed value of $C_i$ corresponds to the initial pixel configuration from step 142, process 180 moves to step 184.

If the currently computed value of $C_i$ does not correspond to the initial pixel configuration from step 142, the currently computed value of $C_i$ corresponding to a present pixel configuration is compared to a previously computed value of $C_i$ corresponding to a previous pixel configuration. If the currently computed value of $C_i$ indicates an improvement in the selected performance criteria relative to the previously computed value of $C_i$, process 180 proceeds to step 184.

At step 184, a non-linear optimization procedure is employed that generates a reconfigured pixel structure having new locations for various elements of the pixels structure. Exemplary teachings on such non-linear optimization procedures can be found in the following publication: Philip E. Gill, Walter Murray, and Margaret H. Wright, "Practical Optimization", Academic Press, Inc., San Diego, Calif., 1981. In one embodiment, the reconfigured pixel structure that includes placement of additional electrical isolated metallic elements within the pixel structure and/or or placement of non-current carrying metallic appendages from necessary pixel components. In one embodiment, the reconfigured pixel structure includes modifications to the materials employed for portions of the pixel structure and, thus, modifications to the material properties of portions of the pixel structure. In one embodiment, the reconfigured pixel structure includes modifications to geometric shapes of necessary pixel components and/or geometric shapes to electrically isolated metallic elements. Again, while original code may be developed, one suitable commercial code is the MATLAB 6.5®—Optimization Toolbox 2.2®.

After generating the reconfigured pixel structure, process 180 proceeds to step 186, where CC 188 automatically enters the reconfigured pixel structure into EFST 150. EFST 150 calculates OE for the reconfigured pixel structure and provides the calculated OE to CC 188. At step 182, CC 188 computes a current value of $C_i$ for the present (reconfigured) pixel structure and compares this currently computed value of $C_i$ to a stored value of $C_i$ corresponding to the preceding pixel configuration. Process 180 continues this optimization process (steps 182, 184, 186, 144, 146, and 148) as long as the currently calculated value of $C_i$ indicates an improvement in the selected performance criteria relative to the value of $C_i$ for the preceding pixel configuration. At a point where the currently calculated value of $C_i$ indicates a worsening of the selected performance criteria relative to the value of $C_i$ for the preceding pixel configuration, the optimization process is halted and process 180 proceeds to step 190 wherein the pixel structure corresponding to the preceding value of $C_i$ is indicated as being the structure best suited for substantially optimizing the selected performance criteria, $C_i$.

While processes 140 and 180 of FIGS. 7 and 9 describe a method for configuring a pixel structure to optimize select performance criteria with regard to a single pixel, processes 140 and 180 can be individually applied to each pixel of an array in order to optimize performance of an image sensor, such as APS 30 of FIG. 1. Since the angle of incident light is unique for each pixel in an array, the unique characteristics of the incident light corresponding to each pixel can be entered into the EFST 150 at step 144 for processes 140 and 180. Additionally, each pixel of the can have a configuration designed to optimize a different performance criteria. For example, a green channel pixel can be configured with a pixel structure that optimizes its response to light from the green portion of the visible spectrum while a red channel pixel can be configured with a pixel structure array that optimizes its response to light from the red portion of the visible spectrum. Other pixels in the array may be configured with structures to minimize cross-talk. As such, processes 140 and 180 enable each pixel of the array to be uniquely structured such that the combined effect of all the pixels of the array optimizes at least one aspect of the image sensor's performance.

In addition to the directly measurable performance criteria described above, such as those illustrated by Equations I, II, and III, CC 182 can also be configured to optimize performance criteria associated with human visual perception. Such performance criteria require CC 182 to include color-metric techniques, such as C-IELAB® and S-C-IELAB®, that enable CC 182 to compute OE-dependent functions that model human visual perception so as to provide pixel configurations for each pixel of an array, such that a resulting image provided by the pixel array is optimized with regard to human visual perception. An optimal image based on human visual perception may not correspond to an optimal image based on directly measurable performance criteria.

Figure 10A:
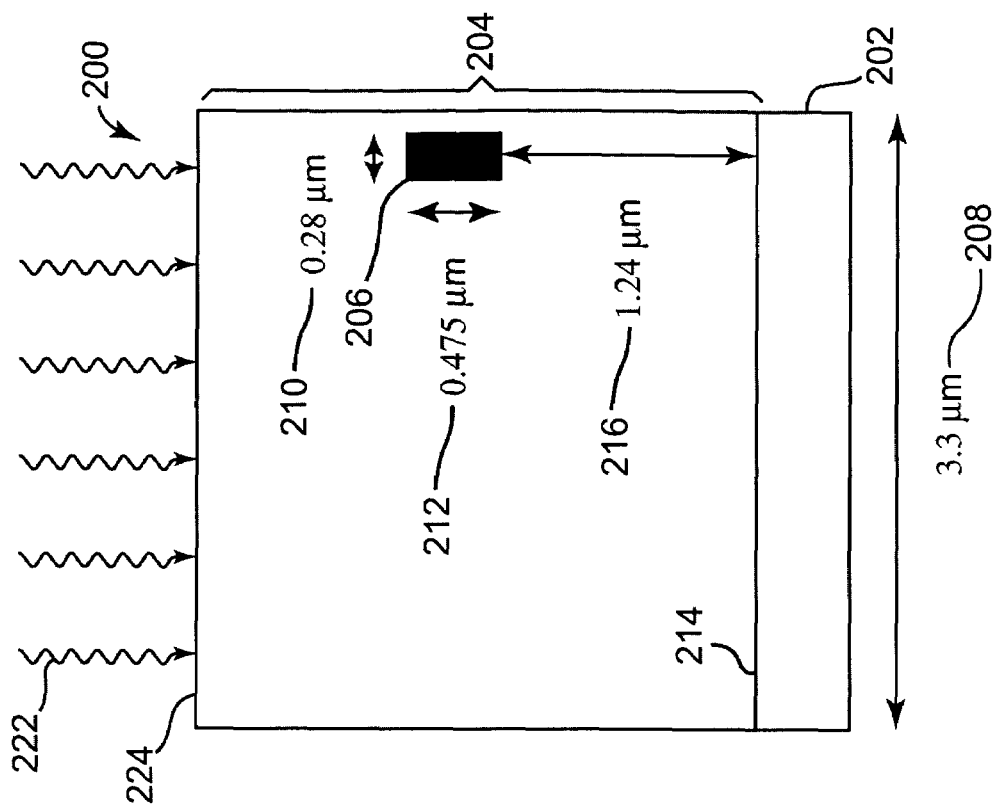
FIG. 10A illustrates a cross section through a portion of an example pixel.
Figure 10B:
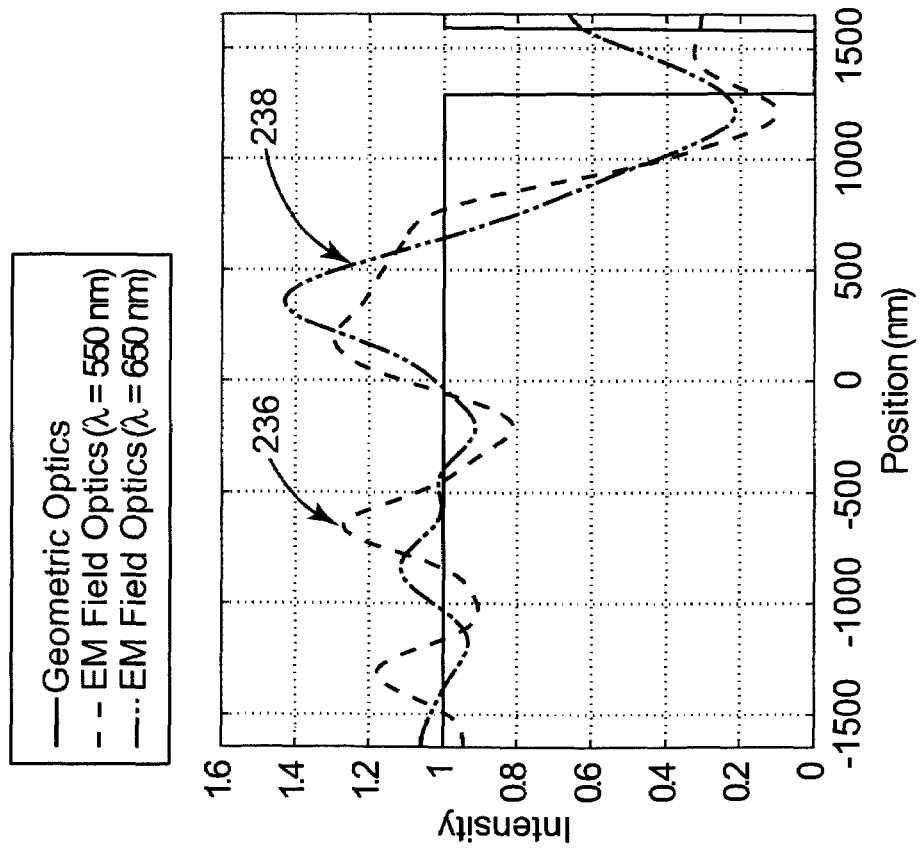
FIG. 10B is a graph illustrating the intensity of light upon a substrate of the pixel of FIG. 10A using geometric simulation and electromagnetic field simulation techniques.

FIGS. 10A and FIG. 10B are included to illustrate the disparity in results obtained by geometric analysis techniques (such as ray tracing) and electromagnetic field simulation techniques when simulating a "shadow" created within a pixel by a metallic element in the optical path of incident light. FIG. 10A is a cross-section illustrating the structure of a simplified pixel 200 employed by both the geometric and electromagnetic field simulations. Pixel 200 includes a silicon substrate 202, a dielectric layer 204, and a metallic wire 206. Pixel 200 is 3.3 μm pixel, as indicated at 208. Wire 206 has a width 210 of 0.28 μm and a depth 212 of 0.475 μm, and is positioned 1.24 μm from a surface 214 of silicon substrate 202, as indicated at 216.

FIG. 10B is a graph 220 illustrating the intensity of light that is received at surface 214 via dielectric layer 204 from light 222 that is normal to and incident upon an upper surface 224 of pixel 200. The intensity of the light is indicated on the y-axis, as indicated at 226, and the position along the surface 214 of silicon substrate illustrated along the x-axis, as indicated at 228, wherein the zero position, as indicated at 230, corresponds to the center of pixel 200. Curve 232 illustrates the intensity of the light at surface 214 based on geometrical analysis techniques. As indicated at 234, geometrical analysis techniques indicate that the intensity of light at surface 214 directly below wire 206 is zero, while the intensity across the remaining portions of surface 214 is consistent at a value of one. As demonstrated by curve 232, geometric analysis techniques predict that wire 206 will affect the light intensity at surface 214 only directly below wire 206 by casting a simple geometric "shadow" on surface 214.

Curves 236 and 238 illustrate the intensity of light reaching surface 214 from normal incident light 222 at surface 224 based electromagnetic field simulations. Curve 236 illustrates the intensity of light received at surface 214 for green light having a wavelength of 550 nanometers (nm), while curve 236 illustrates the intensity for red light having a wavelength of 650 nm. As is evident from curves 236 and 238, based on electromagnetic field simulation techniques, wire 206 does not cast a simple "shadow", but affects the intensity of light across the entire width 208 of surface 214. While curves 236 and 238 indicate that wire 206 reduces the intensity of light at surface 214 most in the areas generally below wire 206, it also demonstrates that wire 206 causes the light intensity to increase and decrease in a periodic nature across the width of pixel 200, with such effects lessening with distance from wire 206. Furthermore, while FIG. 9B includes illustrations of light intensity for only red and green light, it evident from curves 236 and 238 that the affect wire 206 has on the intensity of light at surface 214 is dependent on and changes with the wavelength of incident light 222.

In summary, the electromagnetic field simulation techniques according to the present invention provide more accurate modeling of the effects of pixel structure on the propagation of incident light through a pixel by taking into account the electromagnetic nature of light. By using these techniques, pixel configurations can be automatically determined and simulated so as to optimize selected criteria associated with the performance of a pixel prior to fabrication of the pixel or an array of pixels of an image sensor, thereby reducing design costs while simultaneously improving performance. In addition, these techniques may result in pixel configurations that are counter to conventional design techniques, such as the intentional placement of metallic elements between a pixel's surface and its associated photodetector, and placement of metallic elements in close proximity to the photodetector rather than as far away as possible.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated waveguide comprising:
    a dielectric structure configured to receive a first electromagnetic field distribution via a first major surface and having a second major surface, the first electromagnetic field distribution producing a second electromagnetic field distribution within the dielectric structure; and
    a least one metallic element disposed in the dielectric structure between the first major surface and the second major surface, the at least one metallic element structured and positioned to effect the second electromagnetic field distribution to increase an amount of the second electromagnetic field distribution that is incident upon a selected region of the second major surface.

2. The waveguide of claim 1, wherein the dielectric structure comprises a structure selected from the group consisting of solid dielectric material and a plurality of layers of dielectric materials.

3. The waveguide of claim 1, wherein the first and second electromagnetic field distributions comprise light from the visible spectrum.

4. The waveguide of claim 1, wherein the increase in the amount of the second electromagnetic field distribution incident upon the selected region of the second major surface comprises a portion of the second electromagnetic field distribution substantially corresponding to light having a selected wavelength.

5. The waveguide of claim 1, wherein the increase in the amount of the second electromagnetic field distribution incident upon the selected region of the second major surface comprises a portion of the second electromagnetic field distribution substantially corresponding to light having a wavelength within a selected range of wavelengths.

6. The waveguide of claim 1, wherein the increase in the amount of the second electromagnetic field distribution incident upon the selected region of the second major surface comprises a portion of the second electromagnetic field distribution substantially corresponding to light incident upon the first major surface having an angle of incidence with the first major surface substantially equal to a selected angle of incidence.

7. The waveguide of claim 1, wherein the increase in the amount of the second electromagnetic field distribution incident upon the selected region of the second major surface comprises a portion of the second electromagnetic field distribution substantially corresponding to light incident upon the first major surface having an angle of incidence with the first major surface within a selected range of angles of incidence.

8. The waveguide of claim 1 wherein the increase in the amount of the second electromagnetic field distribution incident upon the selected region of the second major surface comprises a portion of the second electromagnetic field distribution substantially corresponding to light incident upon the first major surface having one or more polarizations.

* * * * *